(12) United States Patent
Deleonibus

(10) Patent No.: US 7,425,496 B2
(45) Date of Patent: Sep. 16, 2008

(54) METHOD FOR DELINEATING A CONDUCTING ELEMENT DISPOSED ON AN INSULATING LAYER, DEVICE AND TRANSISTOR THUS OBTAINED

(75) Inventor: Simon Deleonibus, Claix (FR)

(73) Assignee: Commissariat a l'Energie Atomique, Paris (FR)

( * ) Notice: Subject to any disclaimer, the term of this patent is extended or adjusted under 35 U.S.C. 154(b) by 390 days.

(21) Appl. No.: 10/546,009

(22) PCT Filed: Mar. 1, 2004

(86) PCT No.: PCT/FR2004/000467

§ 371 (c)(1),
(2), (4) Date: Aug. 18, 2005

(87) PCT Pub. No.: WO2004/082004

PCT Pub. Date: Sep. 23, 2004

(65) Prior Publication Data

US 2006/0172523 A1 Aug. 3, 2006

(30) Foreign Application Priority Data

Mar. 5, 2003 (FR) .................................. 03 02721

(51) Int. Cl.
*H01L 21/425* (2006.01)
(52) U.S. Cl. ........................ 438/528; 438/592; 438/657; 257/E21.206
(58) Field of Classification Search ................ 438/528, 438/532, 592, 657; 257/E21.206
See application file for complete search history.

(56) References Cited

U.S. PATENT DOCUMENTS

| 3,867,148 | A | 2/1975 | O'Keeffe et al. |
| 4,666,556 | A | 5/1987 | Fulton et al. |
| 6,331,490 | B1 | 12/2001 | Stevens et al. |
| 6,451,657 | B1 | 9/2002 | Gardner et al. |
| 2001/0020723 | A1 | 9/2001 | Gardner et al. |
| 2002/0132394 | A1 * | 9/2002 | Ku et al. ............... 438/142 |

FOREIGN PATENT DOCUMENTS

JP A 2002-134544 5/2002

OTHER PUBLICATIONS

"Defect-free Si in Regrown Simox Structures," vol. 35, No. 3, pp. 60-61, Aug. 1992.

* cited by examiner

*Primary Examiner*—Chandra Chaudhari
(74) *Attorney, Agent, or Firm*—Oliff & Berridge, PLC

(57) ABSTRACT

A conducting layer is deposited on an insulating layer disposed on a substrate. A mask is formed on at least one area of the conducting layer, thus delineating in the conducting layer at least one complementary area not covered by the mask. The complementary areas of the conducting layer are rendered insulating by oxidation. Oxidation can comprise oxygen implantation and/or thermal oxidation. The material of the conducting layer and the oxygen can form a volatile oxide evaporating partly or totally. The conducting layer is preferably formed by first and second conducting layers. Thus, oxidation can be performed, after the mask has been removed, so that the surface of the second conducting layer is oxidized on the side walls and on the front face.

11 Claims, 5 Drawing Sheets

METHOD FOR DELINEATING A CONDUCTING ELEMENT DISPOSED ON AN INSULATING LAYER, DEVICE AND TRANSISTOR THUS OBTAINED

BACKGROUND OF THE INVENTION

The invention relates to a method for delineating a conducting element disposed on an insulating layer, comprising deposition of a conducting layer on the front face of the insulating layer disposed on a substrate, formation of a mask on at least one area of the conducting layer designed to form the conducting element, so as to delineate in the conducting layer at least one complementary area not covered by the mask, the complementary areas of the conducting layer being rendered insulating by oxidation.

STATE OF THE ART

Microelectronic devices often comprise conducting elements 1 (FIG. 3) separated from a substrate 4 by a very thin insulating layer 2. For example, the gate of metal oxide semiconductor (MOS) transistors of different natures, in particular made of metal, is separated from the semi-conducting substrate by an insulating layer the thickness whereof may be about a few nanometers. A typical fabrication method of such a conducting element is illustrated in FIGS. 1 to 3. Formation of the conducting element 1 is achieved by deposition of a layer of conducting material 3 on an insulating layer 2, disposed on a substrate 4, and delineation by etching of the layer of conducting material 3 through a photoresist mask 5 that is then removed. The mask is formed on an area 6 of the conducting layer 3 designed to form the conducting element 1, thus delineating, in the conducting layer and insulating layer, complementary areas 7 not covered by the mask 5. However, etching may damage (for example deform or oxidize) the complementary areas 7 of the insulating layer 2 and of the substrate 4, which is all the more difficult to prevent the smaller the thickness of the insulating layer 2. It is a fact that selective etching of the conducting material 3 with respect to the material of the insulating layer 2 certainly enables the etching to be stopped before the substrate 4 is reached. However selective etching is difficult to achieve. For example, titanium nitride (TiN) etching is typically performed by fluorohydrocarbon-based ($CH_xF_y$) processes. The same processes are used for etching of oxides, in particular silica ($SiO_2$). The selectivity of etching of the insulating layer with respect to the TiN is therefore very low and damage to the oxide, or even piercing of the insulating layer and damage to the underlying substrate, is inevitable.

In certain known processes, the substrate 4 can be oxidized or deformed at the end of etching through the insulating layer 2. This oxidation can be disadvantageous, in particular in the case of a Silicon on Insulator (SOI) substrate comprising a very thin active layer the resistance whereof is thus greatly increased.

The document JP2002 134,544 describes a method for delineating a metal electrode. A metal layer is formed on an insulating layer disposed on a semi-conducting substrate. A photoresist mask is formed on an area of the metal layer. The metal layer is transformed by oxygen ion implantation in an insulating oxide layer in the area not covered by the photoresist mask. A metal electrode surrounded by an oxide layer is thus formed.

OBJECT OF THE INVENTION

The object of the invention is to remedy these shortcomings and, in particular, to delineate a conducting element disposed on an insulating layer without damaging the insulating layer and the substrate, so as to preserve the resistance characteristics of the device.

According to the invention, this object is achieved by the accompanying claims.

According to a first alternative embodiment of the invention, the conducting layer is formed by first and second conducting layers, the method comprising etching of the second conducting layer by means of the mask, oxidation being performed after the mask has been removed, so that the surface of the second conducting layer is oxidized on the side walls and on the front face and that the complementary areas of the first conducting layer are oxidized over the whole thickness of the first conducting layer.

According to a second alternative embodiment of the invention, the method comprises stabilizing and evaporating annealing so that the material of the conducting layer and the oxygen arising from oxidation form a volatile oxide, the conducting layer evaporating at least partly.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
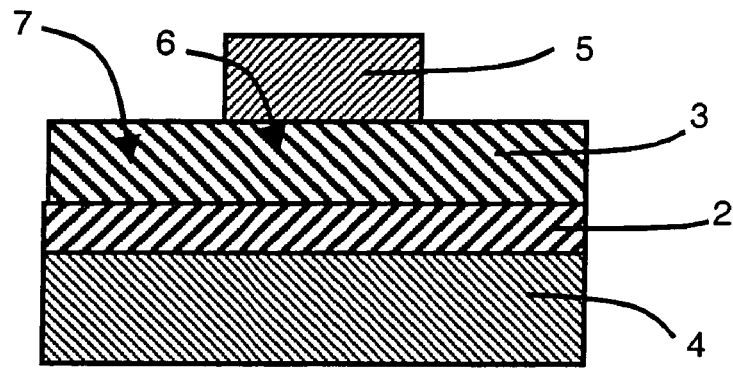
FIGS. 1 to 3 represent a method according to the prior art.
Figure 2:
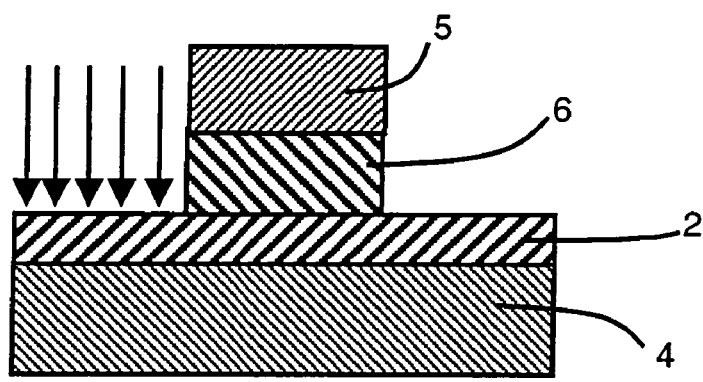
Figure 3:
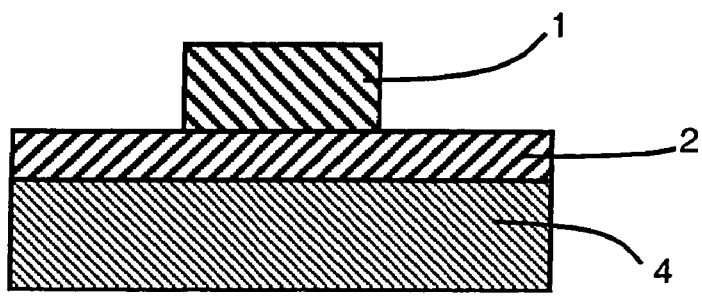
Figure 4:
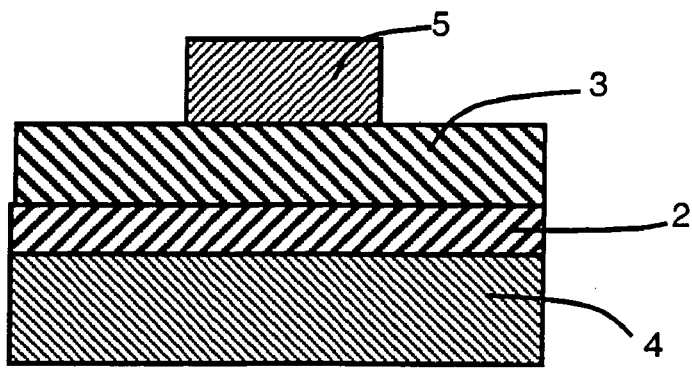
FIGS. 4 to 6 represent different steps of a particular embodiment of a method according to the invention, comprising formation of a volatile oxide.
Figure 5:
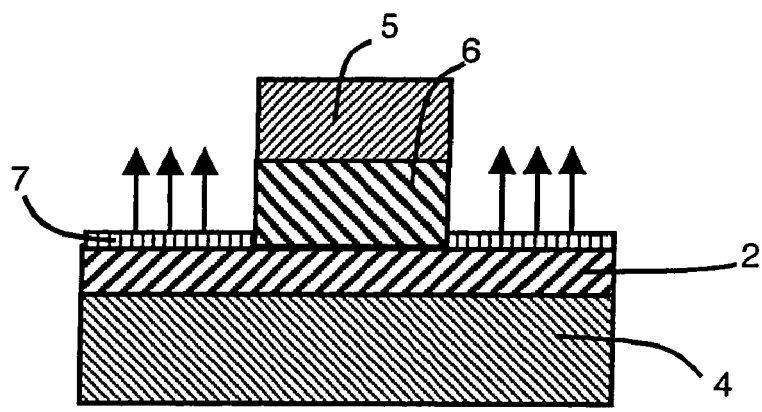
Figure 6:
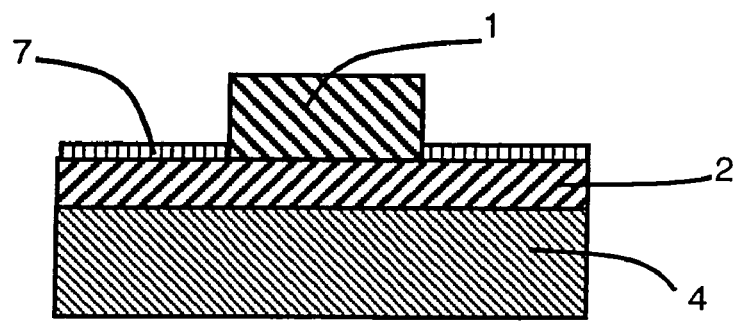

FIG. 4 shows stacking of a semi-conducting substrate 4 (for example Si, Ge, SiGe), of an insulating layer 2 and of a conducting layer 3. A mask 5 is disposed on the front face, on the area 6 of the conducting layer 3 designed to form the conducting element, thus delineating, in the conducting layer, complementary areas 7 not covered by the mask 5. The mask 5 can be made of photoresist or formed by a bilayer (a layer of organic photoresist and a mineral sacrificial layer called "hard mask"). In the particular embodiment represented in FIGS. 5 and 6, in order to delineate a conducting element, the complementary areas 7 of the conducting layer 3 are rendered insulating by thermal oxidation. As represented in FIG. 5, during oxidation, the material of the conducting layer 3 and the oxygen form a volatile oxide so that the complementary areas 7 of the conducting layer 3 evaporate partly during oxidation. The residual complementary areas 7 of the conducting layer 3 are oxidized over their whole thickness, whereas the area 6 of the conducting layer is protected by the mask 5. The material of the conducting layer is chosen among materials the oxide whereof is insulating so that the complementary areas 7 are no longer conducting after oxidation. Then the mask 5 is removed (FIG. 6).

Figure 7:
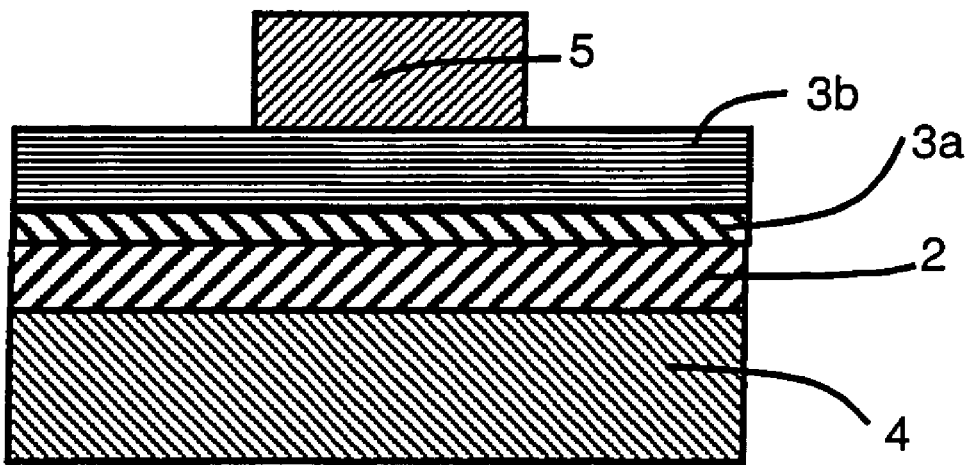
FIGS. 7 to 10 represent steps of another particular embodiment of a method according to the invention, comprising formation of a volatile oxide, using first and second conducting layers.
Figure 8:
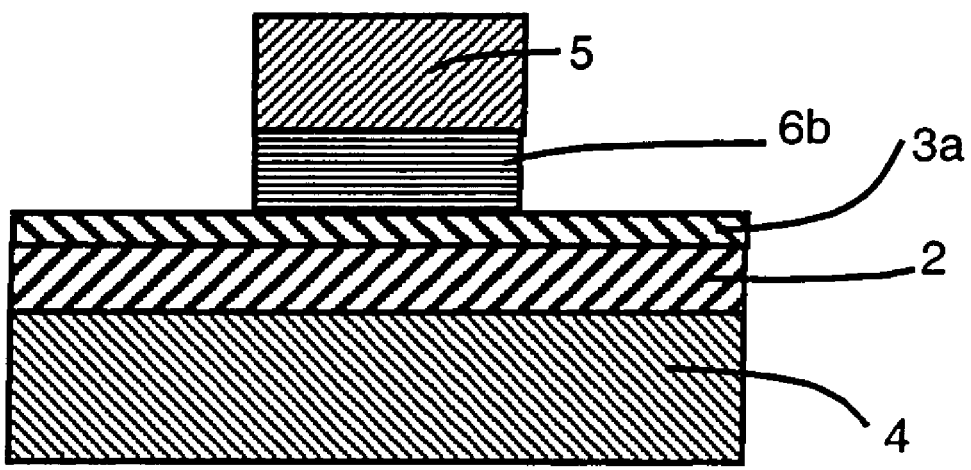

In FIG. 7, the conducting layer 3 is formed by superposed first and second conducting layers 3a and 3b. The mask 5 is formed above the layers 3a and 3b. The second conducting layer 3b can be etched before oxidizing of the layer 3a. As represented in FIG. 8, when the complementary areas 7 of the second conducting layer 3b are removed by etching, only the area 6b of the second conducting layer 3b is kept.

Figure 9:
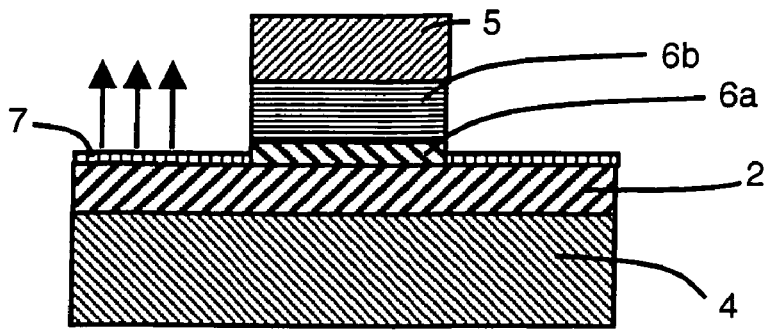
Figure 10:
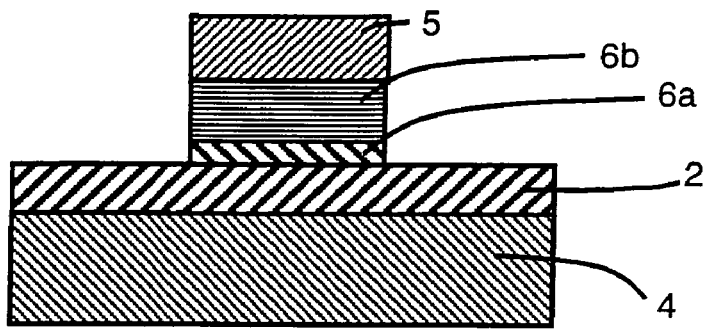

In another alternative embodiment, the method comprises stabilizing and evaporating annealing after oxygen implantation using ion or plasma implantation techniques. Implantation is for example performed by oxygen ion acceleration or by a reactive ion etching (RIE) process. FIG. 9 illustrates evaporation of the oxidized complementary areas 7 of the first conducting layer, the area 6a of the first conducting layer 3a being protected by the mask 5. During annealing, the material of the first conducting layer 3a and the implanted oxygen form a volatile oxide and the oxidized complementary areas 7 of the conducting layer 3a evaporate. The conducting element 1 is then formed by superposition of the residual part (area 6b) of the layer 3b and by the non-oxidized part (area 6a) of the layer 3a. According to the annealing time and the implanted oxygen dose, the complementary areas evaporate partly (FIG. 9) or totally (FIG. 10). Removal of the mask 5 can be performed after annealing if the mask is mineral. In the case of a photoresist mask, it can be removed beforehand.

For application of the method, with evaporation, the material of the first conducting layer 3a is preferably taken from the group comprising tungsten, molybdenum, nickel and cobalt, and the material of the second conducting layer 3b is polycrystalline silicon, a metal nitride or a metal silicide containing for example tungsten, tantalum or molybdenum ($WSi_x$, $MoSi_x$, $TaSi_x$).

For example, using a first conducting layer 3a made of tungsten, the oxygen atoms are implanted in the tungsten crystal in a metastable state, for example on interstitial sites. A tungsten oxide then forms during stabilizing annealing. The $WO_x$ type oxide (x being comprised between 1 and 3) is volatile and evaporates. Typically this phenomenon can be obtained above 200° C. In the case of this technique, lateral oxygen diffusion is almost eliminated and the peripheral oxidation of the area 6a of the first conducting layer 3a under the area 6b of the second conducting layer 3b, represented in FIG. 11, is very low.

Figure 11:
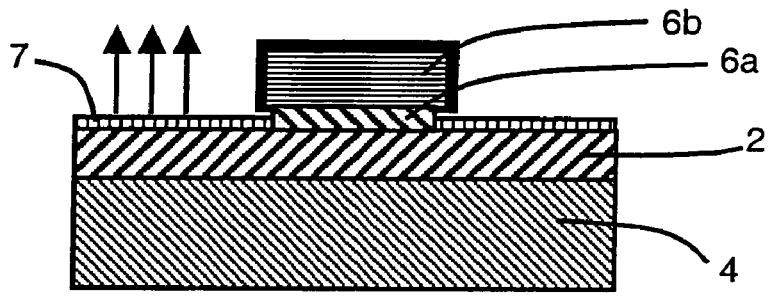
FIGS. 11 and 12 represent steps of another particular embodiment of a method according to the invention, comprising formation of a volatile oxide, after the mask has been removed.
Figure 12:
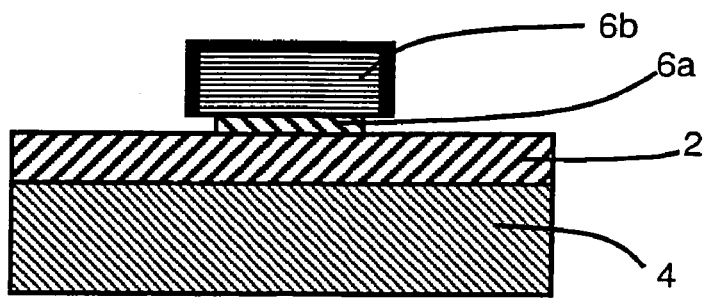

In another development of the method with evaporation, represented in FIGS. 11 and 12, a volatile oxide is formed by thermal oxidation from the material of the conducting layer 3 and from the oxygen. In FIG. 11, the conducting layer 3 is formed by a first conducting layer 3a and an etched second conducting layer 3b. After the photoresist mask 5 has been removed, thermal oxidation can be performed in a furnace, for example at a temperature of more than 200° C. for tungsten. In this case, a volatile oxide of the tungsten $WO_3$ is formed and evaporates. FIGS. 11 and 12 illustrate this method respectively during evaporation and after complete evaporation. This method fosters diffusion of the oxygen atoms in the conducting material and the periphery of the area 6a of the first conducting layer 3a is oxidized under the area 6b of the second conducting layer 3b. This peripheral area thus also evaporates and a device is obtained the area 6b of the second conducting layer 3b whereof is salient at the periphery of the area 6a of the first conducting layer 3a. The area 6a of the first conducting layer 3a is thus reduced. In order to limit reduction of the area 6a and damage to the substrate 4, the thermal oxidation can be stopped as soon as the second conducting layer has evaporated or just before. The complementary areas 7 rendered insulating can then preferably present a thickness at least equal to one atomic layer. As represented in FIGS. 11 and 12, the material of the second conducting layer 3b is oxidized at the surface on the side walls and on the front face.

The gate electrode of a transistor can be achieved by the method described above. In this case, the substrate 4 is formed by an active layer of semi-conducting material, for example homogeneous silicon or silicon on insulator (SOI). The method according to the invention enables the gate electrode to be delineated preventing deformation of the areas of the substrate corresponding to the complementary areas 7 and preventing diffusion of the oxidizing species in the active layer or in the insulating layer between the gate electrode and the active layer. Fabricating the gate electrode by means of two superposed layers 3a and 3b presents several advantages. This in particular makes it possible to reduce the stresses exerted by the conducting material on the insulator, to mask source and drain implantations made after the gate electrode has been achieved, to ensure a contact with the interconnections, to prevent any oxidation of the gate material subsequent to fabrication of the gate electrode and to protect the gate material from self-aligned metallization (siliconizing) of the source and drain.

Figure 13:
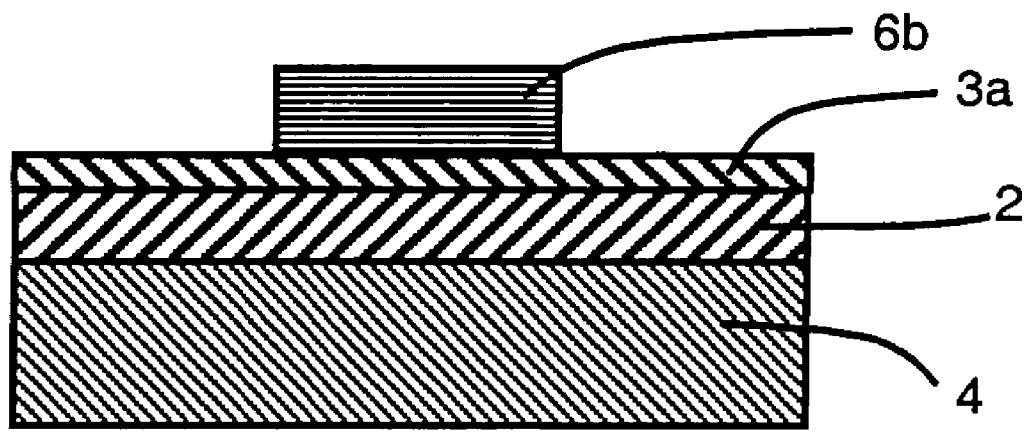
FIGS. 13 and 14 represent steps of another particular embodiment of a method according to the invention, comprising formation of a solid oxide, after the mask has been removed.
Figure 14:
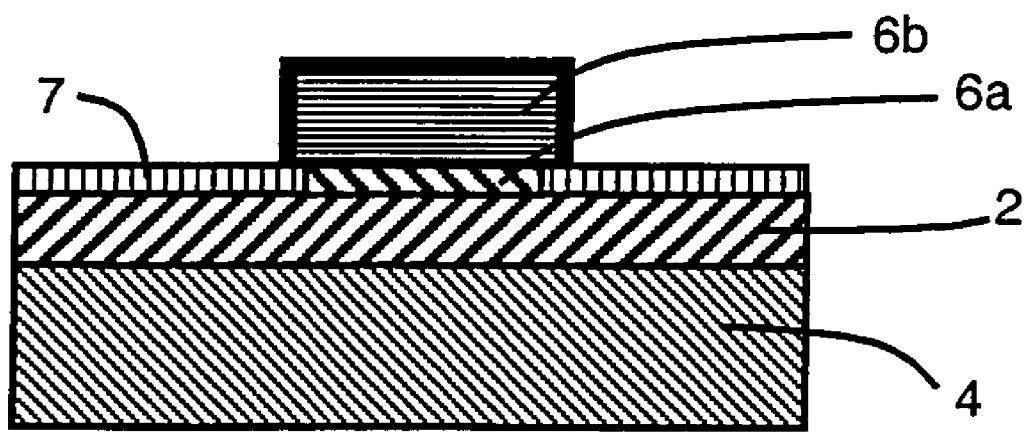

In another alternative embodiment of the invention, the mask 5 is removed (FIG. 13) after etching of the second conducting layer 3b (FIG. 8). The complementary areas 7 of the first conducting layer 3a are then oxidized by oxygen implantation, under suitable temperature and pressure conditions, or by thermal oxidation. In this case, represented in FIG. 14, the material of the second conducting layer 3b is oxidized at the surface both on its side walls and on its front face, whereas the complementary areas 7 of the first conducting layer 3a are oxidized over the whole thickness of the first conducting layer 3a. Diffusion of the atoms in the materials at high temperature, in particular in the case of thermal oxidation, can also lead to peripheral oxidation of the area 6a of the first conducting layer 3a under the second conducting layer 3b, as represented in FIG. 14. The first conducting layer 3a is preferably made of TiN and the second conducting layer 3b is made of polycrystalline silicon. Thus, an oxynitride $TiO_xN_y$ forms when oxidation is performed.

In the case of an oxygen implantation, a thermal stabilization of the metastable state of the layer comprising oxygen implanted by annealing in an inert atmosphere, for example an argon atmosphere, is preferably added. In this case, as in the case of thermal oxidation, the complementary areas 7 of the conducting layer 3 can form a solid oxide in which the oxygen atoms and the atoms of the conducting material are integrated in a single crystalline network, the oxygen atoms replacing for example the atoms of the conducting material. Thus, the conducting element 1 is formed by the non-insulating, in particular non-oxidized, parts of the conducting layer, whereas the areas rendered insulating form a lateral barrier of the conducting element.

The invention is not limited to the embodiments represented, in particular oxidation can be performed either thermally or by oxygen implantation, after the mask has been removed. Moreover, formation of a volatile oxide, before or after the mask is removed, can be achieved by thermal oxidation or by oxygen implantation using a single conducting layer or two superposed conducting layers.

The invention claimed is:

1. Method for delineating a conducting element disposed on an insulating layer, the method comprising:
    depositing a conducting layer on the front face of the insulating layer disposed on a substrate,
    forming a mask on at least one area of the conducting layer designed to form the conducting element, so as to delineate in the conducting layer at least one complementary area not covered by the mask,
    introducing oxygen to the complementary areas of the conducting layer, and
    oxidizing the complementary areas of the conducting layer, to form a volatile oxide from the material of the conducting layer and oxygen, wherein the complementary areas of the conducting layer are rendered insulating by oxidation and evaporate at least partly.

2. Method according to claim 1, wherein oxidizing the complementary areas of the conducting layer is performed before the mask is removed.

3. Method according to claim 1, wherein oxidizing the complementary areas of the conducting layer is performed after the mask has been removed.

4. Method according to claim 1, wherein formation of the volatile oxide and evaporation of the conducting layer take place during the oxidizing of the complementary areas of the conducting layer.

5. Method according to claim 1, wherein oxidizing the complementary areas of the conducting layer comprises stabilizing and evaporating annealing.

6. Method according to claim 1, wherein introducing oxygen to the complementary areas of the conducting layer comprises oxygen implantation.

7. Method according to claim 1, wherein oxidizing the complementary areas of the conducting layer comprises thermal oxidation.

8. Method according to claim 1, wherein the complementary areas of the conductive layer rendered insulating by oxidation have a thickness at least equal to one atomic layer.

9. Method according to claim 1 wherein the conducting layer depositing step comprises at least:
    a first depositing step to form a first conducting layer and
    a second depositing step to form a second conducting layer on the front face of the first conducting layer.

10. Method for delineating a conducting element disposed on an insulating layer, comprising:
    deposition of a conducting layer on the front face of the insulating layer disposed on a substrate,
    formation of a mask on at least one area of the conducting layer designed to form the conducting element, so as to delineate in the conducting layer at least one complementary area not covered by the mask, the complementary areas of the conducting layer being rendered insulating by oxidation, method comprising formation, in said complementary areas of the conducting layer, of a volatile oxide from the material of the conducting layer and the oxygen arising from oxidation, the conducting layer evaporating at least partly,
    wherein the deposition of the conducting layer comprises a first step of deposition of a first conducting layer and a second step of deposition of a second conducting layer on the front face of the first conducting layer, and
    etching of the second conducting layer after formation of the mask and before oxidation.

11. Method according to claim 10, wherein the material of the first conducting layer is taken from the group comprising tungsten, molybdenum, nickel and cobalt, and the material of the second conducting layer is polycrystalline silicon.

* * * * *